United States Patent
Huang et al.

(10) Patent No.: US 11,068,093 B2
(45) Date of Patent: Jul. 20, 2021

(54) TOUCH DISPLAY PANEL

(71) Applicant: Au Optronics Corporation, Hsinchu (TW)

(72) Inventors: Te-Chun Huang, New Taipei (TW); Wen-Yi Hsu, Taoyuan (TW); Zeng-De Chen, Yunlin County (TW); Pei-Ming Chen, New Taipei (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/596,733

(22) Filed: Oct. 8, 2019

(65) Prior Publication Data

US 2020/0225793 A1    Jul. 16, 2020

(30) Foreign Application Priority Data

Jan. 16, 2019   (TW) .................................. 108101709

(51) Int. Cl.
*G06F 3/041*    (2006.01)
*G02F 1/1333*   (2006.01)
*H01L 27/12*    (2006.01)

(52) U.S. Cl.
CPC ........ *G06F 3/0412* (2013.01); *G02F 1/13338* (2013.01); *G06F 3/04164* (2019.05); *H01L 27/124* (2013.01); *G02F 2201/121* (2013.01)

(58) Field of Classification Search
CPC ............... G06F 3/0412; G06F 3/04164; G02F 1/13338; H01L 2201/121
USPC ......................................................... 345/173
See application file for complete search history.

(56) References Cited

U.S. PATENT DOCUMENTS

| | | | |
|---|---|---|---|
| 9,329,424 B2 | 5/2016 | Chae et al. | |
| 9,429,785 B2 | 8/2016 | Chae et al. | |
| 2016/0062164 A1 | 3/2016 | Chae et al. | |
| 2016/0216544 A1 | 7/2016 | Chae et al. | |
| 2016/0291721 A1* | 10/2016 | Shepelev | G06F 3/0443 |
| 2018/0150181 A1* | 5/2018 | Aoyama | G06F 3/0443 |

FOREIGN PATENT DOCUMENTS

| | | |
|---|---|---|
| TW | I539348 | 6/2016 |
| TW | 201704960 | 2/2017 |

* cited by examiner

*Primary Examiner* — Amare Mengistu
*Assistant Examiner* — Gloryvid Figueroa-Gibson
(74) *Attorney, Agent, or Firm* — JCIPRNET

(57) ABSTRACT

A touch display panel is provided, including a common electrode ring, a first and a second common electrode pattern, pixel structures, an edge common signal line, and common signal lines disposed on a substrate. The first and second common electrode patterns and the pixel structures are located in a region surrounded by the common electrode ring. The first common electrode pattern is spaced from the second common electrode pattern by a gap. The first and the second common electrode patterns respectively overlap some of the pixel structures. The edge common signal line is disposed on the substrate, traces along the gap, and extends toward the common electrode ring to be electrically connected to the common electrode ring. The first common electrode pattern overlaps and is electrically connected to one common signal line. The second common electrode pattern overlaps and is electrically connected to another common signal line.

15 Claims, 7 Drawing Sheets

TOUCH DISPLAY PANEL

CROSS-REFERENCE TO RELATED APPLICATION

This application claims the priority benefit of Taiwan application serial no. 108101709, filed on Jan. 16, 2019. The entirety of the above-mentioned patent application is hereby incorporated by reference herein and made a part of this specification.

BACKGROUND

Technical Field

The disclosure relates to an electronic component, and more particularly to a touch display panel.

Related Art

Combination of touch technology and display technology has become a popular design trend in current electronic products. In a display panel with a touch component therein, a problem is often encountered that the circuit layout cannot be easily arranged. For example, in order to integrate the touch component into the display panel, one design is to divide a common electrode in the display panel for transmitting a common voltage into a plurality of touch electrodes so that these touch electrodes are in signal independence from each other. However, at a gap between the touch electrodes, due to the absence of the common electrode, abnormal display effect at the corresponding position may occur.

SUMMARY

The disclosure provides a touch display panel having both touch and display functions while capable of maintaining good touch and display quality.

A touch display panel according to an embodiment of the disclosure includes a substrate, a common electrode ring, a first common electrode pattern, a second common electrode pattern, a plurality of pixel structures, an edge common signal line, and a plurality of common signal lines. The common electrode ring is disposed on the substrate. The first common electrode pattern is disposed on the substrate and located in a region surrounded by the common electrode ring. The second common electrode pattern is disposed on the substrate and located in the region surrounded by the common electrode ring. The first common electrode pattern and the second common electrode pattern are spaced from each other in a row direction by a gap. The pixel structures are disposed on the substrate and arranged in an array in the region surrounded by the common electrode ring. The first common electrode pattern overlaps at least a portion of the pixel structures, and the second common electrode pattern overlaps at least another portion of the pixel structures. The edge common signal line is disposed on the substrate, traces along the gap, and extends toward the common electrode ring to be electrically connected to the common electrode ring. The first common electrode pattern overlaps and is electrically connected to one of the common signal lines, and the second common electrode pattern overlaps and is electrically connected to another one of the common signal lines.

In an embodiment of the disclosure, the touch display panel further includes a third common electrode pattern. The third common electrode pattern is disposed on the substrate and located in the region surrounded by the common electrode ring. The first common electrode pattern and the third common electrode pattern are adjacent to each other in a column direction, and the third common electrode pattern overlaps and is electrically connected to still another one of the common signal lines.

In an embodiment of the disclosure, the common signal line overlapped by and electrically connected to the first common electrode pattern extends across the third common electrode pattern and is signal-independent of the third common electrode pattern.

In an embodiment of the disclosure, the touch display panel further includes an auxiliary common signal line. The auxiliary common signal line is disposed on the substrate. The auxiliary common signal line overlaps and is electrically connected to the first common electrode pattern. Further, the auxiliary common signal line may not overlap the third common electrode pattern, and a fictitious extension line of the auxiliary common signal line coincides with the common signal line overlapped by and electrically connected to the third common electrode pattern.

In an embodiment of the disclosure, the common signal lines, the edge common signal line and the auxiliary common signal line are arranged at equal intervals.

In an embodiment of the disclosure, each of the pixel structures includes an active device and a pixel electrode. The pixel electrode is electrically connected to the active device, and the first common electrode pattern and the second common electrode pattern are located between the pixel electrode and the substrate.

In an embodiment of the disclosure, the touch display panel further includes a plurality of scan lines and a plurality of data lines. The scan lines and the data lines are disposed in the region surrounded by the common electrode ring and cross over each other. One of the scan lines is adapted to turn on the active device of one of the pixel structures, so as to transmit a signal on one of the data lines to the pixel electrode of the pixel structure.

In an embodiment of the disclosure, the edge common signal line, the common signal lines and the data lines are in the same film layer.

In an embodiment of the disclosure, the touch display panel further includes a conducting electrode. The conducting electrode is connected between the first common electrode pattern and the corresponding common signal line, and the conducting electrode and the pixel electrode are in the same film layer.

In an embodiment of the disclosure, the touch display panel further includes an edge conducting electrode. The edge conducting electrode is connected between the edge common signal line and the common electrode ring, and the edge conducting electrode and the pixel electrode are in the same film layer.

In an embodiment of the disclosure, the touch display panel further includes a driving circuit component. The common electrode ring is connected to the driving circuit component.

In an embodiment of the disclosure, the common electrode ring surrounds to form a U-shaped pattern. The driving circuit component is located at an opening of the U-shaped pattern, and the edge common signal line extends toward a bottom of the U-shaped pattern to be electrically connected to the common electrode ring at the bottom of the U-shaped pattern.

In an embodiment of the disclosure, the touch display panel further includes an edge conducting electrode connecting the edge common signal line with the common electrode ring, wherein the common electrode ring surrounds to form a closed annular pattern, and the edge conducting electrode and the driving circuit component are located on the same side of the closed annular pattern.

In an embodiment of the disclosure, the touch display panel further includes two edge conducting electrodes connecting the edge common signal line with the common electrode ring, wherein the common electrode ring surrounds to form a closed annular pattern, and the two edge conducting electrodes are located on two opposite sides of the closed annular pattern.

In an embodiment of the disclosure, the common electrode ring surrounds to form a closed annular pattern. The edge common signal line is divided into two sections, wherein one section is electrically connected to the common electrode ring via an edge conducting electrode, the other section is electrically connected to the common electrode ring via another edge conducting electrode, and the edge conducting electrode and the another edge conducting electrode are respectively located on two opposite sides of the closed annular pattern.

In an embodiment of the disclosure, the touch display panel further includes another edge common signal line extending toward the common electrode ring to be electrically connected to the common electrode ring. The second common electrode pattern is located between the edge common signal line and the another edge common signal line, and an interval between the another edge common signal line and the edge common signal line is the same as an interval between the first common electrode pattern and the second common electrode pattern.

Based on the above, in the touch display panel in accordance with the embodiments of the disclosure, the edge common signal line is located between the common electrode patterns. The edge common signal line is not electrically connected to the common electrode patterns in the touch display panel but is connected to the common electrode ring located at a periphery of the touch display panel. In this way, signal lines for transmitting common signals can be uniformly distributed in the touch display panel. In addition, the edge common signal line is located at the gap between the common electrode patterns and does not need to be connected to the common electrode patterns via the conducting electrode or the like. Thus, the common electrode patterns maintain a certain distance therebetween and are signal-independent of each other.

To make the above features and advantages of the disclosure more comprehensible, examples accompanied with drawings are described in detail as follows.

DESCRIPTION OF THE EMBODIMENTS

Figure 1:
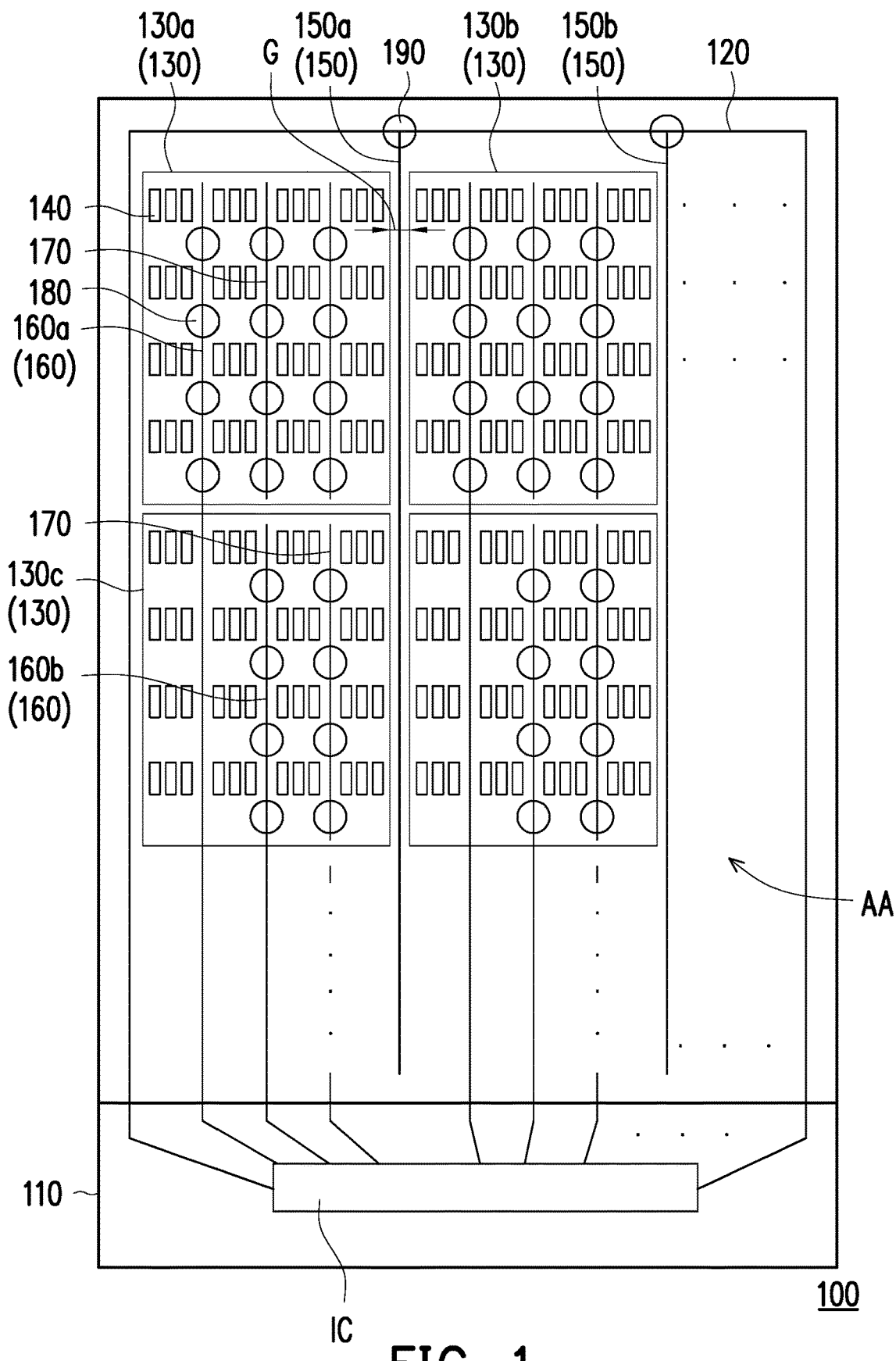
FIG. 1 is a schematic top view of a touch display panel according to an embodiment of the disclosure.

The disclosure will be described comprehensively below with reference to the accompanying drawings, and exemplary embodiments of the disclosure are shown in the drawings. As those skilled in the art would realize, the described embodiments may be modified in various different ways, all without departing from the spirit or scope of the disclosure.

In the accompanying drawings, thicknesses of layers, films, panels, regions and so on are exaggerated for clarity. Throughout the specification, the same reference numerals denote the same elements. It will be understood that when an element such as a layer, film, region or substrate is referred to as being "on" or "connected to" another element, it can be directly on or connected to the other element, or intervening elements may also be present. In contrast, when an element is referred to as being "directly on" or "directly connected to" another element, there are no intervening elements present. As used herein, the term "connected" may refer to physically connected and/or electrically connected. Moreover, "electrically connected" or "coupled" can encompass the presence of other elements between two elements.

In addition, relative terms such as "lower" or "bottom" and "upper" or "top" may be used herein to describe one element's relationship to another element as illustrated in the drawings. It will be understood that the relative terms are intended to encompass different orientations of a device in addition to the orientation depicted in the drawings. For example, if the device in one of the drawings is turned over, elements described as being on the "lower" side of other elements would then be oriented on "upper" sides of the other elements. The exemplary term "lower" can therefore encompass an orientation of "lower" and "upper," depending on the particular orientation of the drawing. Similarly, if the device in one of the drawings is turned over, elements described as "below" or "beneath" other elements would then be oriented "above" the other elements. The exemplary terms "below" or "beneath" can therefore encompass an orientation of above and below.

The term "about," "approximately" or "substantially" as used herein is inclusive of the stated value and means within an acceptable range of deviation for the particular value as determined by those of ordinary skill in the art, considering the measurement in question and the error associated with measurement of the particular quantity (i.e., the limitations of the measurement system). For example, "about" may mean within one or more standard deviations, or within ±30%, ±20%, ±10%, ±5% of the stated value. Moreover, a relatively acceptable range of deviation or standard deviation may be chosen for the term "about," "approximately" or "substantially" as used herein based on optical properties, etching properties or other properties, instead of applying one standard deviation across all the properties.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may typically have rough and/or nonlinear features. Moreover, sharp angles that are illustrated may be rounded. Thus, the regions illustrated in the drawings are schematic in nature and their shapes are not intended to illustrate the precise shape of a region and are not intended to limit the scope of the claims.

Unless otherwise defined, all terms (including technical and scientific terms) used herein have the same meaning as commonly understood by persons of ordinary skill in the art. It will be further understood that terms, such as those defined in commonly used dictionaries, should be interpreted as having a meaning that is consistent with their meaning in the context of the relevant art and the disclosure and will not be interpreted in an idealized or overly formal sense unless expressly so defined herein.

FIG. 1 is a schematic top view of a touch display panel according to an embodiment of the disclosure. A touch display panel 100 includes a substrate 110, and a common electrode ring 120, a plurality of common electrode patterns 130, a plurality of pixel structures 140, a plurality of edge common signal lines 150, and a plurality of common signal lines 160, disposed on the substrate 110. Both the common electrode patterns 130 and the pixel structures 140 are located in a region AA surrounded by the common electrode ring 120. In the present embodiment, the region AA surrounded by the common electrode ring 120 may be a display area of the touch display panel 100; that is, a screen displayed by the touch display panel 100 is presented in the region AA surrounded by the common electrode ring 120. In addition, although not shown in the drawings, the touch display panel 100 may further include a display medium that can be driven by an electric field generated by the pixel structures 140 to emit respective display light with the brightness required in different regions to achieve the display effect. In some embodiments, the display medium may include but not limited to a liquid crystal layer. In other embodiments, the display medium may include a material that can change light transmittance or light reflectivity under driving of the electric field.

In the present embodiment, the plurality of common electrode patterns 130 are independent of each other in both structure and signal, so as to perform touch sensing functions independently. Both the pixel structures 140 and the common electrode patterns 130 are arranged in an array in the region AA surrounded by the common electrode ring 120, and each common electrode pattern 130 overlaps numbers of the pixel structures 140. In addition, a driving circuit component IC may be disposed on the touch display panel 100, and the ends of the common electrode ring 120 are connected to the driving circuit component IC. In other embodiments, the touch display panel 100 may have no driving circuit component IC disposed thereon, and the touch display panel 100 may be connected to a driving circuit component bonded to an external device via a flexible circuit board or similar connecting member.

In order to clearly show relationships between the members, in the following, a first common electrode pattern 130a, a second common electrode pattern 130b and a third common electrode pattern 130c will be used as examples to illustrate an arrangement relationship between the common electrode patterns 130 and a relationship between the members, wherein the first common electrode pattern 130a and the second common electrode pattern 130b are adjacent to each other in a row direction, and the first common electrode pattern 130a and the third common electrode pattern 130c are adjacent to each other in a column direction. That is, the first common electrode pattern 130a and the second common electrode pattern 130b are adjacent common electrode patterns 130 in the same row, and the first common electrode pattern 130a and the third common electrode pattern 130c are adjacent common electrode patterns 130 in the same column.

In the present embodiment, there are a plurality of edge common signal lines 150, such as an edge common signal line 150a, an edge common signal line 150b, and so on, wherein each edge common signal line 150 is disposed between two adjacent common electrode patterns 130 in the same row, and extends toward the common electrode ring 120 to be electrically connected to the common electrode ring 120. For example, the edge common signal line 150a traces along a gap G between the first common electrode pattern 130a and the second common electrode pattern 130b, and extends toward the common electrode ring 120 to be electrically connected to the common electrode ring 120. The edge common signal line 150b traces along a gap between the second common electrode pattern 130b and a common electrode pattern (not shown) of another column, and extends toward the common electrode ring 120 to be electrically connected to the common electrode ring 120. That is, the second common electrode pattern 130b is located between the edge common signal line 150a and the edge common signal line 150b. In addition, in the present embodiment, an interval (a distance between center points of widths) between the first common electrode pattern 130a and the second common electrode pattern 130b may be the same as an interval between the edge common signal line 150a and the edge common signal line 150b.

There are a plurality of common signal lines 160, such as a common signal line 160a, a common signal line 160b, and so on. Each common electrode pattern 130 correspondingly overlaps and is electrically connected to one of the common signal lines 160. Each common signal line 160 is electrically connected to only one of the common electrode patterns 130, but crosses one or more of the common electrode patterns 130 located in the same column. For example, the common signal line 160a crosses and overlaps the first common electrode pattern 130a and the third common electrode pattern 130c, but is electrically connected only to the first common electrode pattern 130a and is signal-independent of the third common electrode pattern 130c.

In addition, the touch display panel 100 may further include a plurality of auxiliary common signal lines 170. Each auxiliary common signal line 170 is disposed on the substrate 100 and located in the region AA surrounded by the common electrode ring 120. Each auxiliary common signal line 170 may overlap one of the common electrode patterns 130, but the number of the auxiliary common signal lines 170 overlapped by each common electrode pattern 130 may not be constant. Each common electrode pattern 130 is electrically connected to the auxiliary common signal line 170 which overlaps the common electrode pattern 130. In the schematic view of FIG. 1, the first common electrode pattern 130a may overlap two auxiliary common signal lines 170, and these two auxiliary common signal lines 170 are both electrically connected to the first common electrode pattern 130a. Meanwhile, the third common electrode pattern 130c overlaps only one auxiliary common signal line 170 and this auxiliary common signal line 170 is electrically connected to the third common electrode pattern 130c. In addition, a fictitious extension line of one of the auxiliary common signal lines 170 overlapping the first common electrode pattern 130a may coincide with the common signal line 160b electrically connected to the third common electrode pattern 130c. That is, the auxiliary common signal line 170 may be located on the same linear path as one of the common signal lines 160.

In the present embodiment, the touch display panel 100 may further include a conducting electrode 180. The conducting electrode 180 is connected between the common signal lines 160 and the common electrode patterns 130. In addition, the auxiliary common signal lines 170 and the corresponding common electrode patterns 130 may also be electrically connected to each other via the conducting electrode 180. Further, the touch display panel 100 may further include an edge conducting electrode 190 connected between the edge common signal lines 150 and the common electrode ring 120. In the present embodiment, the common electrode ring 120 surrounds to form a U-shaped pattern. The driving circuit component IC is located at an opening of the U-shaped pattern, and the edge common signal lines 150 extend toward a bottom of the U-shaped pattern to be electrically connected to the common electrode ring 120 at the bottom of the U-shaped pattern. That is, the edge conducting electrode 190 and the driving circuit component IC may be located on two opposite sides of the common electrode ring 120.

In the present embodiment, the edge common signal lines 150, the common signal lines 160 and the auxiliary common signal lines 170 may be fabricated using the same film layer. Moreover, when the touch display panel 100 performs the touch and display functions, the edge common signal lines 150, the common signal lines 160 and the auxiliary common signal lines 170 all have a common voltage. In addition, the edge common signal lines 150, the common signal lines 160 and the auxiliary common signal lines 170 may be arranged at equal intervals. Therefore, the touch display panel 100 has a circuit layout with a uniform distribution. In addition, since the edge common signal line 150a is not electrically connected to the first common electrode pattern 130a or the second common electrode pattern 130b, there is no need to dispose a conducting electrode connected between the common electrode patterns 130 and the edge common signal lines 150 at the gap G. In this way, the gap G between adjacent common electrode patterns 130 can be secured.

Figure 2:
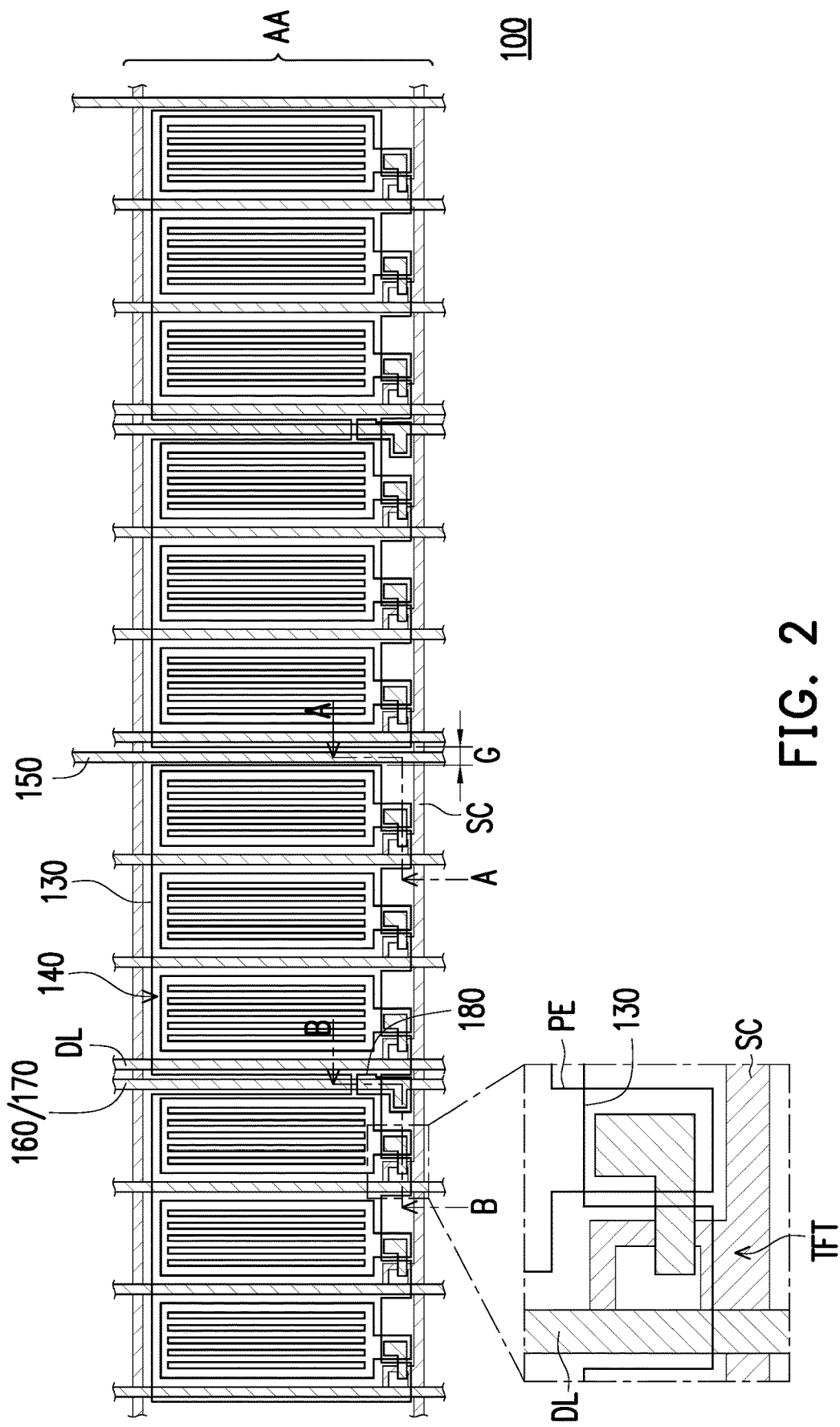
FIG. 2 is a schematic view of an embodiment of a circuit layout of a touch display panel 100.

FIG. 2 is a schematic view of an embodiment of a circuit layout of the touch display panel 100. FIG. 2 is used to explain a possible implementation manner of the circuit layout of individual members in the region AA in the touch display panel 100 of FIG. 1. However, the individual members in FIG. 1 may also be implemented in other manners instead of being limited to the outlines of the members shown in FIG. 2. As can be seen from FIG. 2, the touch display panel 100 further includes a plurality of scan lines SC and a plurality of data lines DL. Both the scan lines SC and the data lines DL are disposed in the region AA surrounded by the common electrode ring 120, and the scan lines SC and the data lines DL are disposed to cross over each other. For example, the scan lines SC each extend along the row direction, and the data lines DL each extend along the column direction. Each scan line SC may cross over all the data lines DL, and each data line DL may cross over all the scan lines SC. Each pixel structure 140 includes an active device TFT and a pixel electrode PE, and the pixel electrode PE is electrically connected to the active device TFT. One of the scan lines SC is adapted to turn on the active device TFT of one of the pixel structures 140, so as to transmit a signal on one of the data lines DL to the pixel electrode PE of the corresponding pixel structure 140.

As can be seen from FIG. 1 and FIG. 2, each common electrode pattern 130 may overlap a plurality of pixel structures 140. Specifically, each common electrode pattern 130 may overlap a plurality of pixel electrodes PE. In the present embodiment, a film layer where the pixel electrodes PE are located is closer to the display medium (e.g., liquid crystal material) of the touch display panel 100 than a film layer where the common electrode patterns 130 are located, and the pixel electrodes PE have a plurality of slits. When the touch display panel 100 displays a screen, corresponding signals are respectively input to the pixel electrodes PE and the common electrode patterns 130, so as to drive the display medium by using an electric field formed by the pixel electrodes PE and the common electrode patterns 130.

Figure 3:
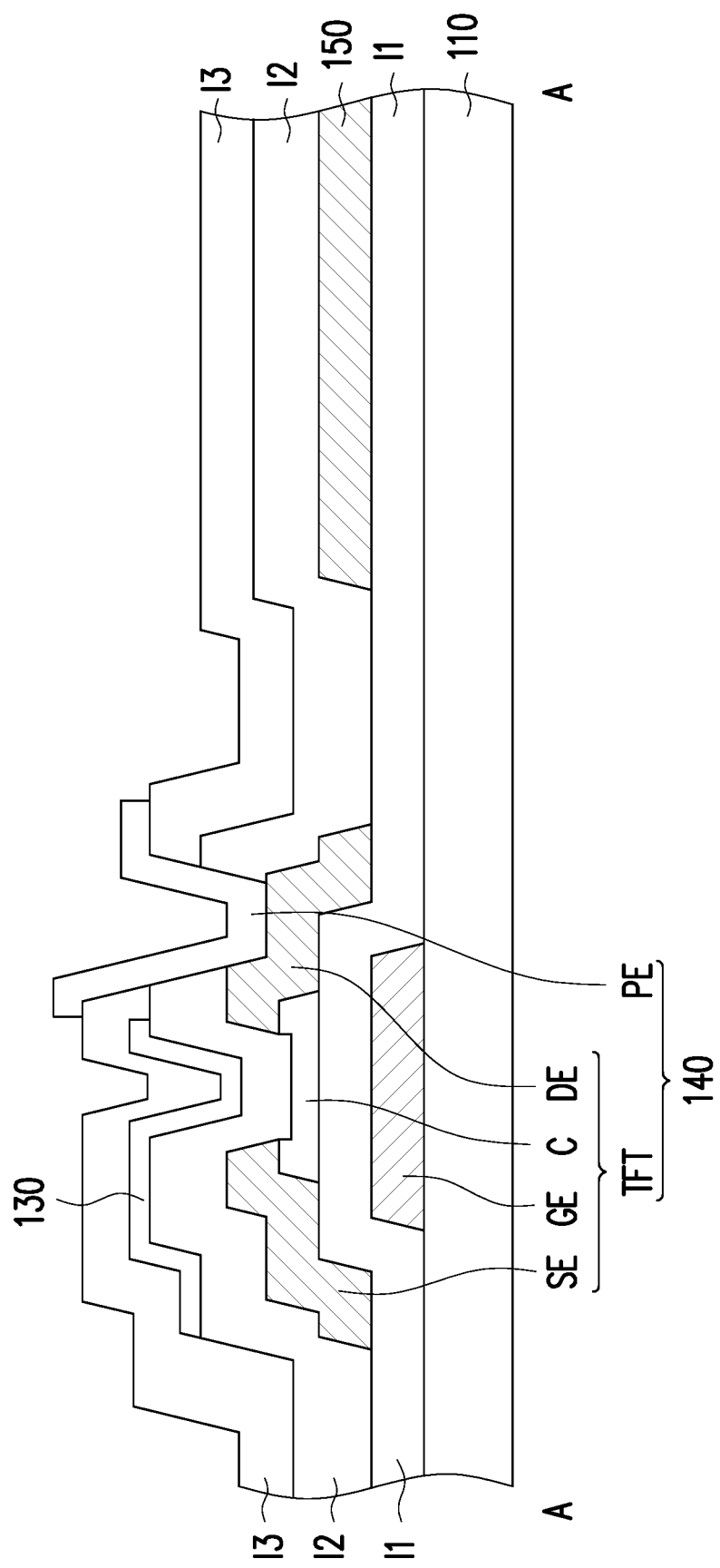
FIG. 3 is a schematic cross-sectional view along section line A-A of FIG. 2.
Figure 4:
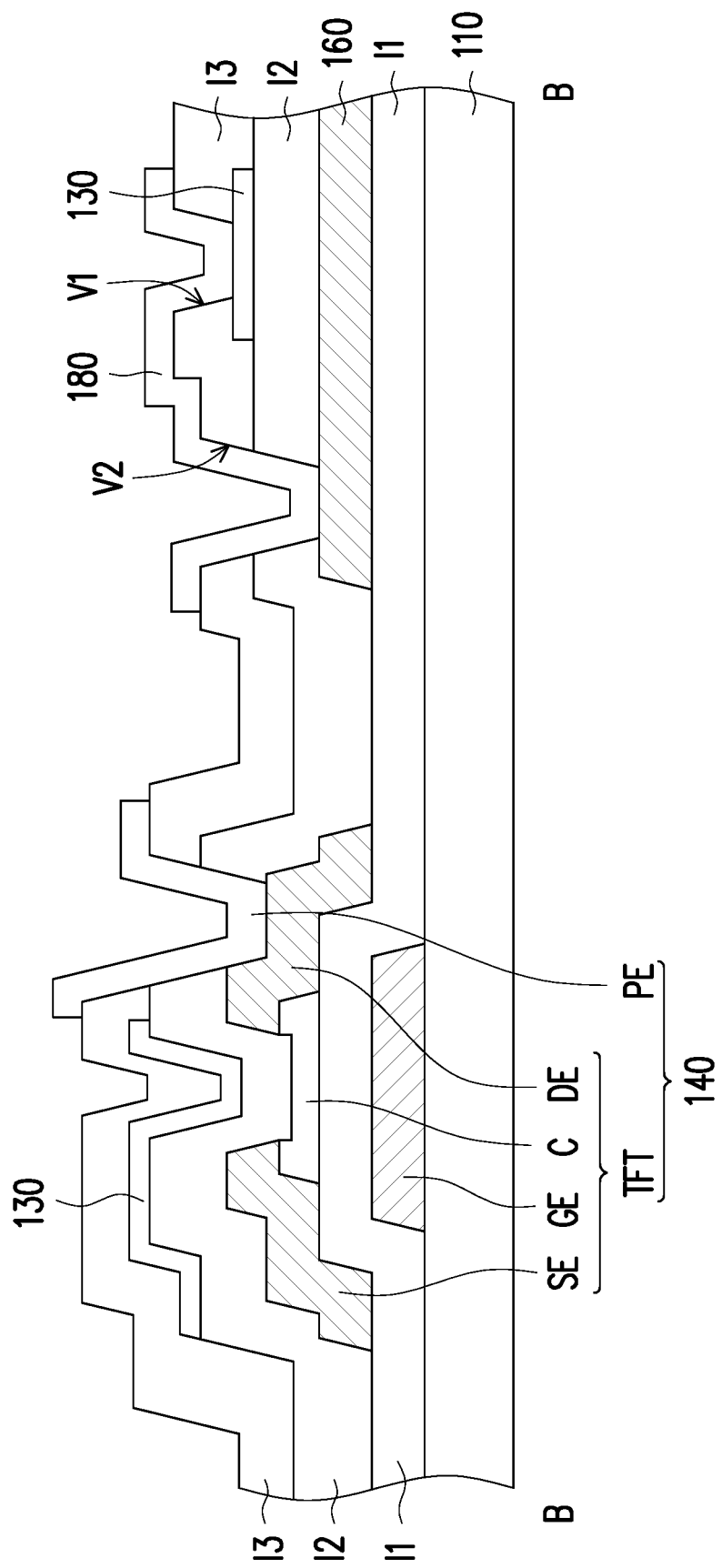
FIG. 4 is a schematic cross-sectional view along section line B-B of FIG. 2.

FIG. 3 is a schematic cross-sectional view along section line A-A of FIG. 2, and FIG. 4 is a schematic cross-sectional view along section line B-B of FIG. 2. Referring to FIG. 2 to FIG. 4, the active device TFT of each pixel structure 140 may include a gate electrode GE, a semiconductor layer C, a source electrode SE and a drain electrode DE. The gate electrode GE overlaps the semiconductor layer C. Both the source electrode SE and the drain electrode DE contact partial semiconductor layer C. The gate electrode GE is connected to one of the scan lines SC. The source electrode SE is connected to one of the data lines DL. The drain electrode DE is connected to the pixel electrode PE. As can be seen from FIG. 3 and FIG. 4, the film layer where the common electrode pattern 130 is located is between the film layer where the pixel electrode PE is located and the substrate 110.

In the present embodiment, the touch display panel 100 may further include a plurality of insulating layers I1 to I3. The gate electrode GE is disposed on the substrate 110. The insulating layer I1 covers the gate electrode GE. The semiconductor layer C, the source electrode SE and the drain electrode DE are disposed on the insulating layer I1. The insulating layer I2 covers semiconductor layer C, the source electrode SE and the drain electrode DE. The common electrode pattern 130 is disposed on the insulating layer I2. The insulating layer I3 covers the common electrode pattern 130. The pixel electrode PE is disposed on the insulating layer I3. In this way, the gate electrode GE, the semiconductor layer C, the source electrode SE, the drain electrode DE, the pixel electrode PE and the common electrode pattern 130 may be isolated based on the electrical signal consideration by the insulating layers I1 to I3.

In addition, as can be seen from FIG. 3 and FIG. 4, the film layer where the edge common signal line 150 and the common signal line 160 are located may be the same as a film layer where the source electrode SE and the drain electrode DE are located. That is, the edge common signal line 150, the common signal line 160 and the auxiliary common signal line 170 are all sandwiched between the insulating layer I1 and the insulating layer I2. In this way, the common electrode pattern 130 and the common signal line 160 have the insulating layer I2 sandwiched therebetween. However, the common electrode pattern 130 and the common signal line 160 may be electrically connected to each other via the conducting electrode 180, and a film layer where the conducting electrode 180 is located is the same as the film layer where the pixel electrode PE is located. Specifically, as shown in FIG. 4, the conducting electrode 180 is disposed on the insulating layer I3, and the conducting electrode 180 is connected to the common electrode pattern 130 via a contact V1 penetrating the insulating layer I3 and to the common signal line 160 via another contact V2 penetrating the insulating layer I3 and the insulating layer I2.

In the present embodiment, as can be seen from FIG. 2 and FIG. 3, no conducting electrode 180 and corresponding contact V1 is disposed on the edge common signal line 150, such that the gap G between the adjacent common electrode patterns 130 can be maintained at a constant size and that the common electrode patterns 130 of adjacent columns can be prevented from being electrically connected to each other by a conducting electrode. This helps ensure that the two adjacent common electrode patterns 130 in the same row are signal-independent of each other. When the touch display panel 100 displays, an electric field generated by the edge common signal line 150 may be applied to the display medium corresponding to the gap G, which helps reduce the probability of occurrence of abnormal display effect at the region near the gap G. In addition, as shown in FIG. 1, in the touch display panel 100, the common signal lines 160, the edge common signal lines 150 and the auxiliary common signal lines 170 are all signal lines to which common signals are input, and these signal lines are arranged at equal intervals, which facilitates uniformization of the circuit layout of the touch display panel 100.

Figure 5:
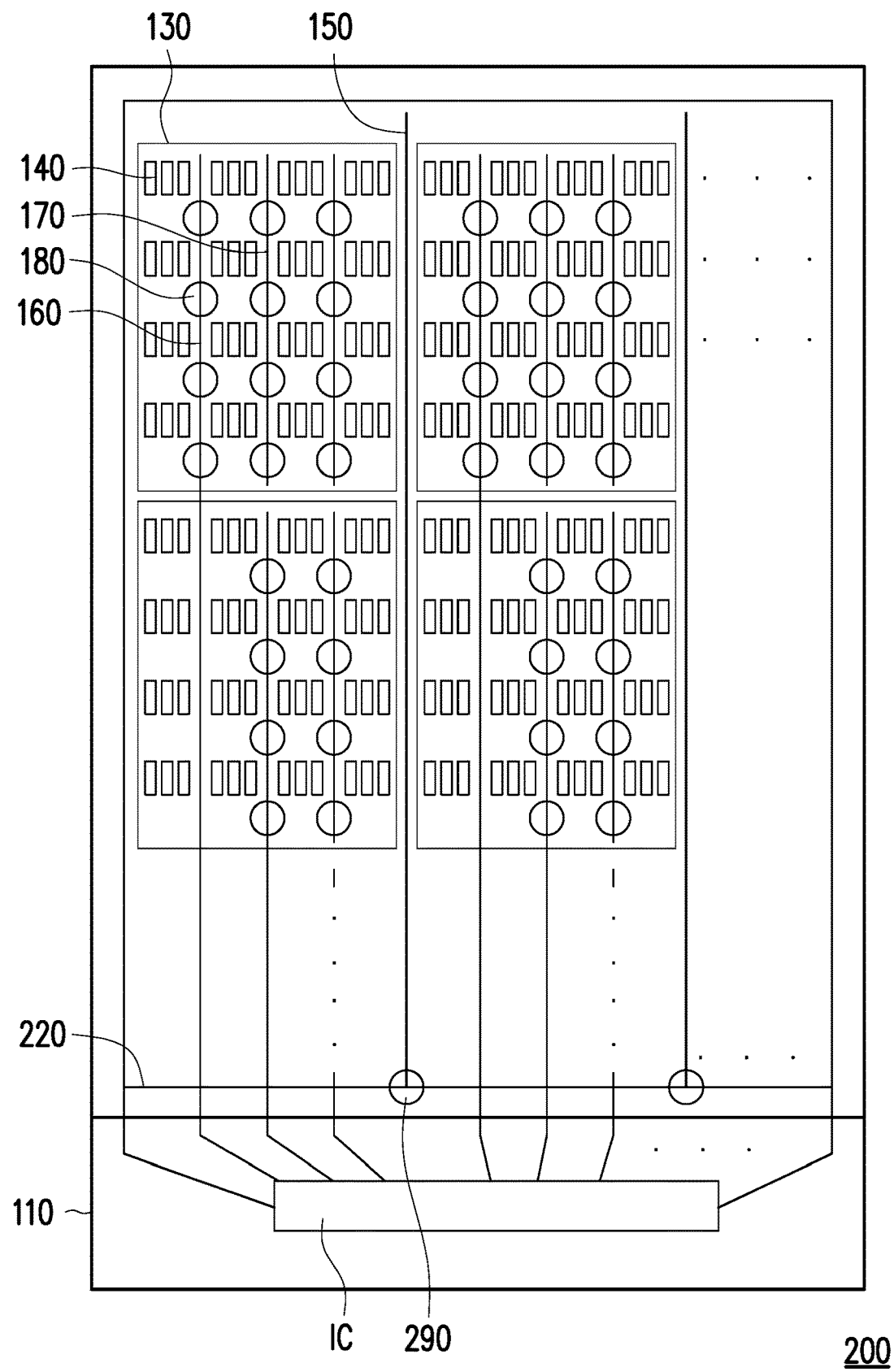
FIG. 5 is a schematic top view of a touch display panel according to another embodiment of the disclosure.

FIG. 5 is a schematic top view of a touch display panel according to another embodiment of the disclosure. A touch display panel 200 is similar to the touch display panel 100. Specifically, the touch display panel 200 includes the substrate 110, a common electrode ring 220, the common electrode pattern 130, the pixel structure 140, the edge common signal line 150, the common signal line 160, the auxiliary common signal line 170, the conducting electrode 180 and an edge conducting electrode 290. The substrate 110, the common electrode pattern 130, the pixel structure 140, the edge common signal line 150, the common signal line 160, the auxiliary common signal line 170 and the conducting electrode 180 of the present embodiment are roughly similar to those of the touch display panel 100, and their specific structures, functions and characteristics can be understood with reference to FIG. 1 to FIG. 4 and corresponding descriptions, and will not be repeated herein.

The present embodiment is different from the touch display panel 100 in that the common electrode ring 220 has a different pattern design from that of the common electrode ring 120, wherein the common electrode ring 120 of FIG. 1 surrounds to form a U-shaped pattern, while the common electrode ring 220 of FIG. 5 surrounds to form a closed annular pattern such as, but not limited to, a rectangular pattern. As can be seen from FIG. 5, the common electrode ring 220 not only surrounds to form a closed annular pattern, but has an extension part extending toward the driving circuit component IC to be connected to the driving circuit component IC. In addition, the edge common signal line 150 and the common electrode ring 220 are connected to each other via the edge conducting electrode 290, and the edge conducting electrode 290 and the driving circuit component IC are located on the same side of the closed annular pattern.

Figure 6:
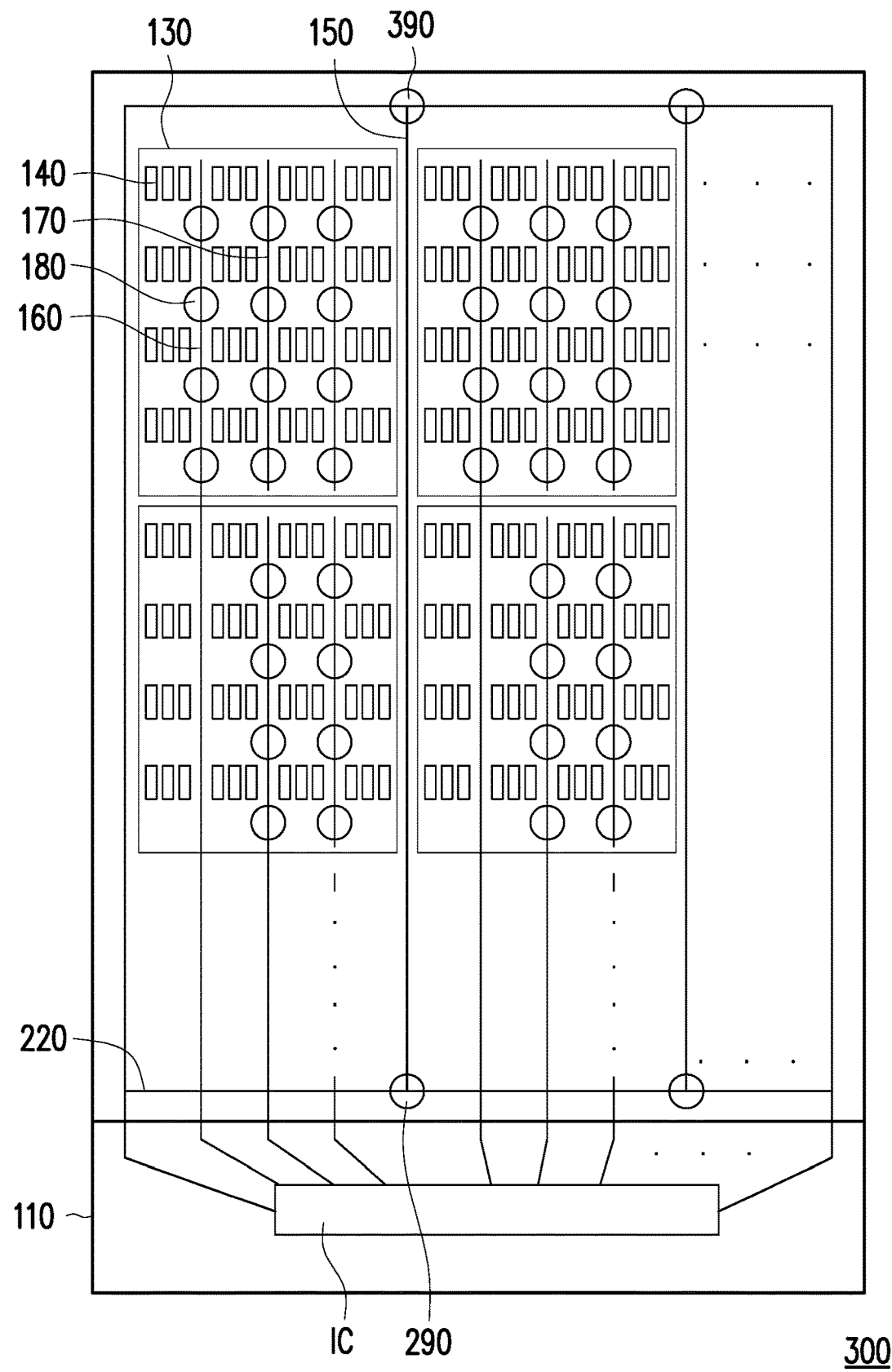
FIG. 6 is a schematic top view of a touch display panel according to still another embodiment of the disclosure.

FIG. 6 is a schematic top view of a touch display panel according to still another embodiment of the disclosure. A touch display panel 300 is similar to the touch display panel 200. Specifically, the touch display panel 300 includes the substrate 110, the common electrode ring 220, the common electrode pattern 130, the pixel structure 140, the edge common signal line 150, the common signal line 160, the auxiliary common signal line 170, the conducting electrode 180, the edge conducting electrode 290 and an edge conducting electrode 390. The substrate 110, the common electrode ring 220, the common electrode pattern 130, the pixel structure 140, the edge common signal line 150, the common signal line 160, the auxiliary common signal line 170, the conducting electrode 180 and the edge conducting electrode 290 of the present embodiment are roughly similar to those of the touch display panel 200, and their specific structures, functions and characteristics can be understood with reference to FIG. 1 to FIG. 5 and corresponding descriptions, and will not be repeated herein. The present embodiment is different from the touch display panel 200 in that the edge common signal line 150 and the common electrode ring 220 are connected to each other via not only the edge conducting electrode 290 but also the edge conducting electrode 390. In addition, the edge conducting electrode 290 and the edge conducting electrode 390 are located on two opposite sides of the closed annular common electrode ring 220.

Figure 7:
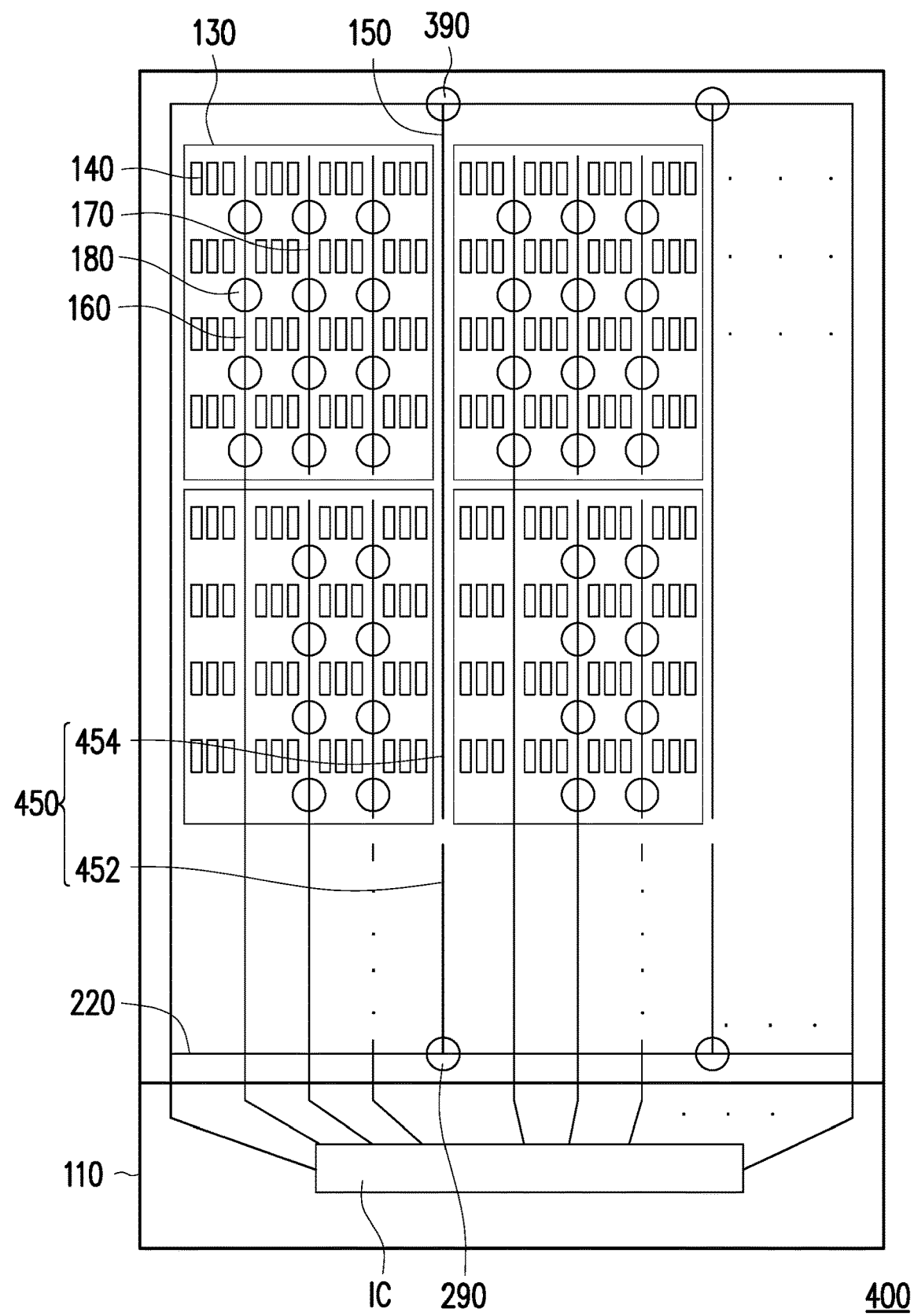
FIG. 7 is a schematic top view of a touch display panel according to yet still another embodiment of the disclosure.

FIG. 7 is a schematic top view of a touch display panel according to yet still another embodiment of the disclosure. A touch display panel 400 is similar to the touch display panel 300. Specifically, the touch display panel 400 includes the substrate 110, the common electrode ring 220, the common electrode pattern 130, the pixel structure 140, an edge common signal line 450, the common signal line 160, the auxiliary common signal line 170, the conducting electrode 180, the edge conducting electrode 290 and the edge conducting electrode 390. The substrate 110, the common electrode ring 220, the common electrode pattern 130, the pixel structure 140, the common signal line 160, the auxiliary common signal line 170, the conducting electrode 180, the edge conducting electrode 290 and the edge conducting electrode 390 of the present embodiment are roughly similar to those of the touch display panel 300, and their specific structures, functions and characteristics can be understood with reference to FIG. 1 to FIG. 6 and corresponding descriptions, and will not be repeated herein. The present embodiment is different from the touch display panel 300 in that the edge common signal line 450 is divided into two sections, 452 and 454, wherein one section 452 is connected to the common electrode ring 220 via the edge conducting electrode 290, and the other section 454 is connected to the common electrode ring 220 via the edge conducting electrode 390. The edge conducting electrode 290 and the edge conducting electrode 390 are respectively located on two opposite sides of the closed annular common electrode ring 220.

In summary, in the touch display panel of at least some embodiments of the disclosure, the edge common signal line is disposed between the common electrode patterns of two adjacent columns. The edge common signal line is connected to the common electrode ring located at the periphery of the touch display panel. In this way, the circuit on the entire touch display panel for transmitting the common signals can be arranged at equal intervals and a uniform circuit layout can be achieved. In addition, since the edge common signal line is not required to be electrically connected to any common electrode pattern, adjacent common electrode patterns maintain a constant gap therebetween. Thus, a contour design of the common electrode pattern can be easily simplified and good touch quality can be provided.

Although the disclosure has been described with reference to the above examples, it will be apparent to one of ordinary skill in the art that modifications to the described examples may be made without departing from the spirit of the disclosure. Accordingly, the scope of the disclosure will be defined by the attached claims and not by the above detailed descriptions.

What is claimed is:
1. A touch display panel, comprising:
 a substrate;
 a common electrode ring disposed on the substrate;

a first common electrode pattern disposed on the substrate and located in a region surrounded by the common electrode ring;

a second common electrode pattern disposed on the substrate and located in the region surrounded by the common electrode ring, wherein the first common electrode pattern and the second common electrode pattern are spaced from each other in a first direction by a gap;

a plurality of pixel structures disposed on the substrate and arranged in an array in the region surrounded by the common electrode ring, wherein the first common electrode pattern overlaps at least a portion of the pixel structures and the second common electrode pattern overlaps at least another portion of the pixel structures;

an edge common signal line disposed on the substrate, tracing along the gap and extending toward the common electrode ring to be electrically connected to the common electrode ring;

a driving circuit component, wherein the edge common signal line is connected to a section of the common electrode ring located between the pixel structures and the driving circuit component; and a plurality of common signal lines disposed on the substrate, wherein the first common electrode pattern overlaps and is electrically connected to one of the common signal lines, and the second common electrode pattern overlaps and is electrically connected to another one of the common signal lines.

2. The touch display panel according to claim 1, further comprising a third common electrode pattern disposed on the substrate and located in the region surrounded by the common electrode ring, wherein the first common electrode pattern and the third common electrode pattern are adjacent to each other in a second direction, and the third common electrode pattern overlaps and is electrically connected to still another one of the common signal lines.

3. The touch display panel according to claim 2, wherein the one of common signal lines overlapped by and electrically connected to the first common electrode pattern extends across the third common electrode pattern and is signal-independent of the third common electrode pattern.

4. The touch display panel according to claim 1, further comprising an auxiliary common signal line, wherein the auxiliary common signal line is disposed on the substrate, and the auxiliary common signal line overlaps and is electrically connected to the first common electrode pattern.

5. The touch display panel according to claim 4, wherein the auxiliary common signal line does not overlap a third common electrode pattern adjacent to the first electrode pattern in a second direction, and a fictitious extension line of the auxiliary common signal line coincides with still another one of the common signal lines overlapped by and electrically connected to the third common electrode pattern.

6. The touch display panel according to claim 4, wherein the common signal lines, the edge common signal line and the auxiliary common signal line are arranged at equal intervals.

7. The touch display panel according to claim 1, wherein each of the pixel structures comprises an active device and a pixel electrode, the pixel electrode is electrically connected to the active device, and the first common electrode pattern and the second common electrode pattern are located between the pixel electrodes of the pixel structures and the substrate.

8. The touch display panel according to claim 7, further comprising a plurality of scan lines and a plurality of data lines, wherein the plurality of scan lines and the plurality of data lines are disposed in the region surrounded by the common electrode ring and cross over each other, and one of the scan lines is adapted to turn on the active device of one of the pixel structures, so as to transmit a signal on one of the data lines to the pixel electrode of the one of the plurality of pixel structures.

9. The touch display panel according to claim 8, wherein the edge common signal line, the common signal lines and the data lines are in a same film layer.

10. The touch display panel according to claim 7, further comprising a conducting electrode connected between the first common electrode pattern and a corresponding common signal line, and the conducting electrode and the pixel electrode are in a same film layer.

11. The touch display panel according to claim 7, further comprising an edge conducting electrode connected between the edge common signal line and the common electrode ring, and the edge conducting electrode and the pixel electrode are in a same film layer.

12. The touch display panel according to claim 1, further comprising an edge conducting electrode connecting the edge common signal line with the common electrode ring, wherein the common electrode ring surrounds to form a closed annular pattern, and the edge conducting electrode and the driving circuit component are located on a same side of the closed annular pattern.

13. The touch display panel according to claim 1, further comprising two edge conducting electrodes connecting the edge common signal line with the common electrode ring, wherein the common electrode ring surrounds to form a closed annular pattern, and the two edge conducting electrodes are located on two opposite sides of the closed annular pattern.

14. The touch display panel according to claim 1, wherein the common electrode ring surrounds to form a closed annular pattern, and the edge common signal line is divided into two sections, wherein one of the two sections is electrically connected to the common electrode ring via an edge conducting electrode, the other of the two sections is electrically connected to the common electrode ring via another edge conducting electrode, and the edge conducting electrode and the another edge conducting electrode are respectively located on two opposite sides of the closed annular pattern.

15. The touch display panel according to claim 1, further comprising another edge common signal line extending toward the common electrode ring to be electrically connected to the common electrode ring, wherein the second common electrode pattern is located between the edge common signal line and the another edge common signal line, and an interval between the another edge common signal line and the edge common signal line is the same as an interval between the first common electrode pattern and the second common electrode pattern.

* * * * *